(12) United States Patent
Jasa et al.

(10) Patent No.: US 7,009,456 B2
(45) Date of Patent: Mar. 7, 2006

(54) PLL EMPLOYING A SAMPLE-BASED CAPACITANCE MULTIPLIER

(75) Inventors: Hrvoje Jasa, Scarborough, ME (US);
Gary D. Polhemus, Sebago, ME (US);
John E. Scoggins, Dover, NH (US)

(73) Assignee: Agere Systems Inc., Allentown, PA (US)

( * ) Notice: Subject to any disclaimer, the term of this patent is extended or adjusted under 35 U.S.C. 154(b) by 183 days.

(21) Appl. No.: 10/633,814

(22) Filed: Aug. 4, 2003

(65) Prior Publication Data

US 2005/0030001 A1 Feb. 10, 2005

(51) Int. Cl.
*H03L 7/00* (2006.01)

(52) U.S. Cl. .............. 331/16; 331/25; 331/117 R; 331/167; 331/177 V; 331/36 C

(58) Field of Classification Search ........... 331/177 V, 331/16, 34, 177 R, 25, 117 R, 167, 36 C See application file for complete search history.

(56) References Cited

U.S. PATENT DOCUMENTS

| 6,614,316 | B1 * | 9/2003 | Masenas et al. ............... 331/17 |
| 6,693,496 | B1 * | 2/2004 | Lebouleux ................... 331/185 |
| 6,909,329 | B1 * | 6/2005 | Jasa et al. .................... 331/1 A |

OTHER PUBLICATIONS

Joseph Adler, "Clock-source jitter: A clear understanding aids oscillator selection"; EDN, Feb. 18, 1999, pp. 79-86.

* cited by examiner

*Primary Examiner*—Arnold Kinkead

(57) ABSTRACT

A phase detector (PD) generates an up/down signal based on the phase error between data and clock signals input to the phase detector. A voltage controlled oscillator (VCO) generates the clock signal. The up/down signal is applied to a proportional charge pump and a truncated version of the up/down signal is applied to an integral charge pump. The proportional charge pump generates a first voltage for a first time period across a resistor based on the up/down signal, while the integral charge pump generates a second voltage for a second time period across a capacitor based upon the truncated version of the up/down signal and the sampling rate of the data signal by the PD. The second time period is less than the first time period. The first and second voltages are combined and applied to the VCO to drive the clock signal to synchronization with the data.

32 Claims, 3 Drawing Sheets

PLL EMPLOYING A SAMPLE-BASED CAPACITANCE MULTIPLIER

BACKGROUND OF THE INVENTION

1. Field of the Invention

The present invention relates to phase-locked loop (PLL) circuits, and, more particularly, to charge-pump PLLs.

2. Description of the Related Art

A phase-locked loop (PLL) is a circuit that generates, or synthesizes, a periodic output signal that has a constant phase and frequency with respect to a periodic input signal. PLLs are widely used in many types of measurement, microprocessor, and communication applications. One type of phase-locked loop is the charge-pump PLL, which is described in Floyd M. Gardner, "Charge-Pump Phase-Lock Loops" *IEEE Trans. Commun.*, vol. COM-28, pp. 1849–1858, November 1980, the teachings of which are incorporated herein by reference.

In a conventional charge-pump phase-locked loop, a phase detector (PD) compares the phase $\theta_{IN}$ of the input signal to the phase $\theta_{OUT}$ of a feedback signal derived from the PLL output. Based on the comparison, the PD generates an error signal: either an UP signal (when $\theta_{IN}$ leads $\theta_{OUT}$) or a DOWN signal (when $\theta_{OUT}$ leads $\theta_{IN}$), where the error signal indicates the magnitude of the difference between $\theta_{IN}$ and $\theta_{OUT}$. A charge pump generates an amount of charge equivalent to the error signal from the PD, where the sign of that charge indicates the direction of UP or DOWN. Depending on whether the error signal was an UP signal or a DOWN signal, the charge is either added to or subtracted from the one or more capacitors in a loop filter. The loop filter may have a relatively simple design, comprising a capacitor $C_S$ in parallel with the series combination of a resistor R and a relatively large capacitor $C_L$. As such, the loop filter operates as an integrator that accumulates the net charge from the charge pump. The resulting loop-filter voltage $V_{LF}$ is applied to a voltage-controlled oscillator (VCO). A voltage-controlled oscillator is a device that generates a periodic output signal, whose frequency is a function of the VCO input voltage. Input and feedback dividers may be placed in the input and feedback paths, respectively, if the frequency of the output signal is to be either a fraction or a multiple of the frequency of the input signal.

In digital data applications in which a locally generated clock is synchronized to input data, one type of PLL is implemented with a PD that observes discrete periods, or snapshots, of the phase error between the input data and the clock. The clock phase is corrected on every data edge based solely on the polarity, or direction, of the phase offset. This type of PD is sometimes referred to as a "bang-bang" PD. A bang-bang PD samples the phase error of the input data in the following way: one sample is taken near the optimal sampling point, termed the center of the eye, and a sample is also taken at or near the transition point where the data switches to a new logic level, termed the edge transition. PLLs with bang-bang PDs are only nearly "locked" to the input data and form non-linear systems that make analysis difficult.

If the sampled data is different from the value sampled during the prior edge transition (termed a prior "edge transition sample"), then the edge transition sample is made before the data changes to a new value. In this case, the system clock is leading, and the PD generates a DOWN signal to decrease the speed, or frequency, of the clock. Similarly, if the sampled data is different from the next edge transition sample, then the system clock is lagging, and the PD generates an UP signal to increase the frequency of the clock. However, bang-bang PDs may introduce excessive jitter in the resulting clock signal since the clock is shrunk or expanded at every edge transition.

SUMMARY OF THE INVENTION

The present invention relates to a phase-locked loop (PLL) circuit comprising a phase detector (PD) generating an up/down signal based on the phase error between a data signal and a clock signal input to the phase detector. The phase error is derived by sampling the clock signal based on the data, and a retimed data signal is generated by the PD by sampling of the data based on the clock signal. A voltage controlled oscillator (VCO) generates the clock signal. The up/down signal is applied to a proportional charge pump and a truncated version of the up/down signal is applied to an integral charge pump. The proportional charge pump generates a first voltage for a first time period across a resistor based on the up/down signal, while the integral charge pump generates a second voltage for a second time period across a capacitor based upon the truncated version of the up/down signal and the sampling rate of the data signal by the PD. The second time period is less than the first time period. The first and second voltages are combined and applied to the VCO to drive the clock signal to synchronization with the data.

In accordance with exemplary embodiments of the present invention, a PLL generates, by phase detection, an up/down signal based on a phase difference between a data signal and a clock signal input to the PD, wherein the phase error is generated by sampling of the clock signal by the data signal. A first voltage for a first time period is generated based on the up/down signal, and a second voltage for a second time period is generated across a capacitor based upon the capacitance of the capacitor, a truncated version of the up/down signal, and a sampling rate of the data by the PD. The second time period is less than the first time period. The clock signal is generated by a voltage-controlled oscillator based upon a combination of the first and the second voltages.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
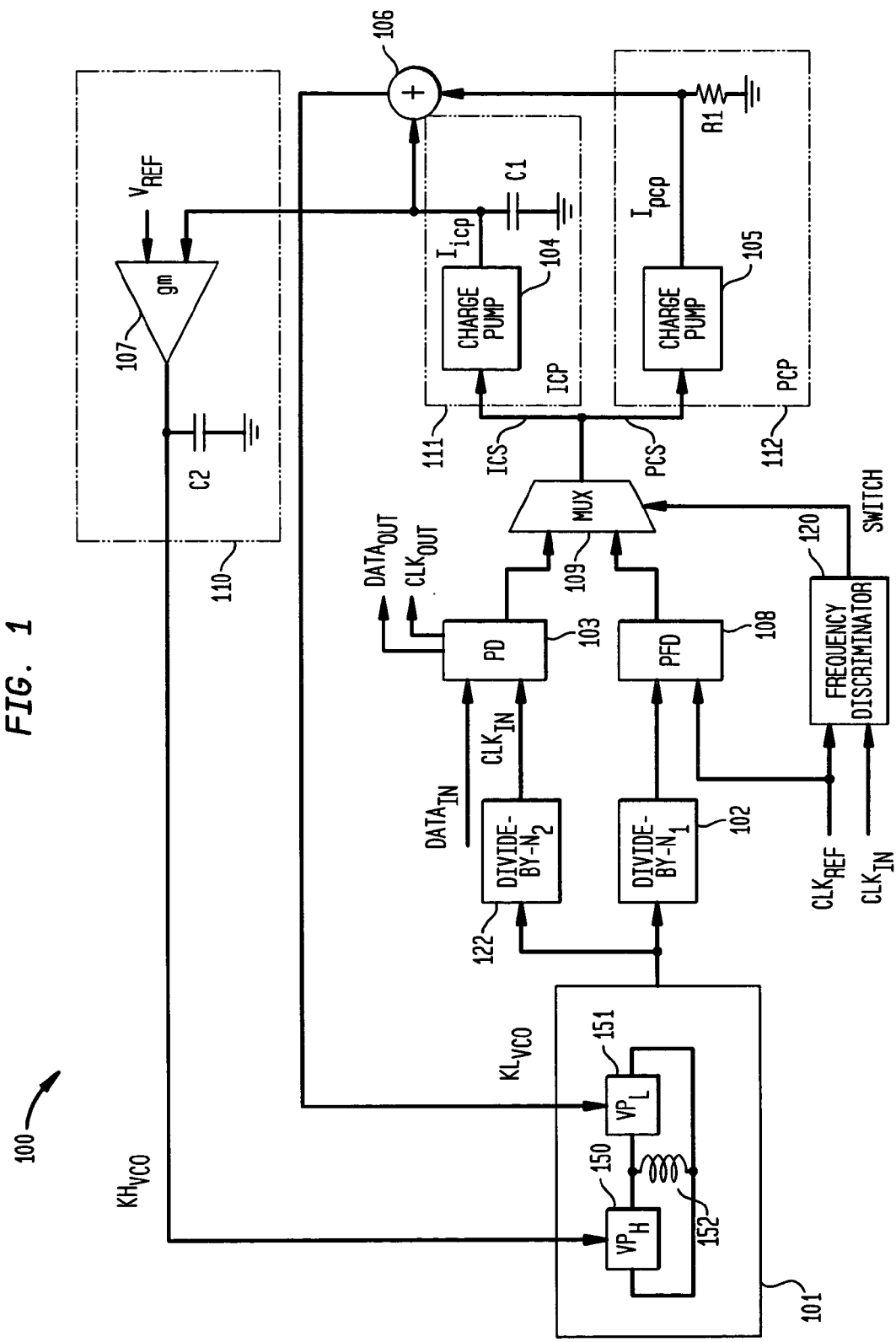
FIG. 1 shows a block diagram of a phase-locked loop operating in accordance with an exemplary embodiment of the present invention.

FIG. 1 shows a block diagram of phase-locked loop (PLL) 100 operating in accordance with an exemplary embodiment of the present invention. PLL 100 comprises voltage controlled oscillator (VCO) 101, divide-by-$N_1$ 102, divide-by-$N_2$ 122, phase detector (PD) 103, integral charge pump (ICP) 111 having charge pump 104 and capacitor C1, proportional charge pump (PCP) 112 having charge pump 105 and resistor R1, voltage adder 106, and process/voltage/temperature (PVT) compensator 110 including amplifier 107 and capacitor C2. Though not explicitly shown in FIG. 1, charge pumps 104 and 105 are coupled to a common ground and biased with a reference voltage $V_{ref}$. PLL 100 tends to synchronize the frequency of the signal provided by VCO 101 to a frequency that is a multiple of the frequency of the input data $DATA_{in}$.

VCO 101 is desirably implemented as an inductor-capacitor (LC) oscillator having a fixed inductor value and a variable capacitor value. The variable capacitor value may be implemented with two pairs of tunable varactors, each varactor pair having a capacitance tuned by an input voltage. One varactor pair sets the dominant, or "large" capacitance, while the other varactor pair sets the minor, or "low" capacitance. For the exemplary embodiment shown in FIG. 1, VCO 101 receives two control voltages, $KL_{vco}$ and $KH_{vco}$. As shown in FIG. 1, inductor 152 is in parallel with varactor pair $VP_H$ 150 controlled by $KH_{vco}$ and varactor pair $VP_L$ 151 controlled by $KL_{vco}$. Each of the two control voltages, $KL_{vco}$ and $KH_{vco}$, sets a capacitance of a corresponding varactor pair. The control voltage $KH_{vco}$ adjusts the large capacitance, while the control voltage $KL_{vco}$ adjusts the low capacitance. Other types of VCOs well-known in the art, such as crystal oscillator VCOs, might be employed for VCO 101.

Control voltage $KH_{vco}$ is set by an outer feedback loop comprising PVT compensator 110 including amplifier 107 with gain gm and capacitor C2. PVT compensator 110 is employed to compensate for variations in operation caused by variations in process (such as semiconductor processes), voltage (such as in power supply), and temperature. Amplifier 107 receives a reference voltage $V_{ref}$ to set a nominal operating frequency of VCO 101. In addition, amplifier 107 receives the voltage appearing across C1, which voltage is a function of the current $I_{icp}$ from charge pump 104. Effects of PVT variations of PLL 100 in the frequency of VCO 101 are exhibited at the voltage across C1, since the average DC voltage across C1. Variations in voltage across C1 are adjusted by (gm/C2) by PVT compensator 110 and applied to VCO 101 so as to minimize effects of the variations. Control voltage $KL_{vco}$ is set by an inner feedback loop as described subsequently.

Divide-by-$N_2$ 122 divides the output signal frequency of VCO 101 by $N_2$, $N_2$ a positive number, to generate the clock $CLK_{in}$. For a bang-bang PD, $CLK_{in}$ may be generated so as to have a frequency that is twice the frequency of the input data $DATA_{in}$. Divide-by-$N_2$ 122 may be implemented with a counter that counts by $N_2$. Other dividers, such as fractional dividers, may also be employed for divide-by-$N_2$ 122.

Figure 2:
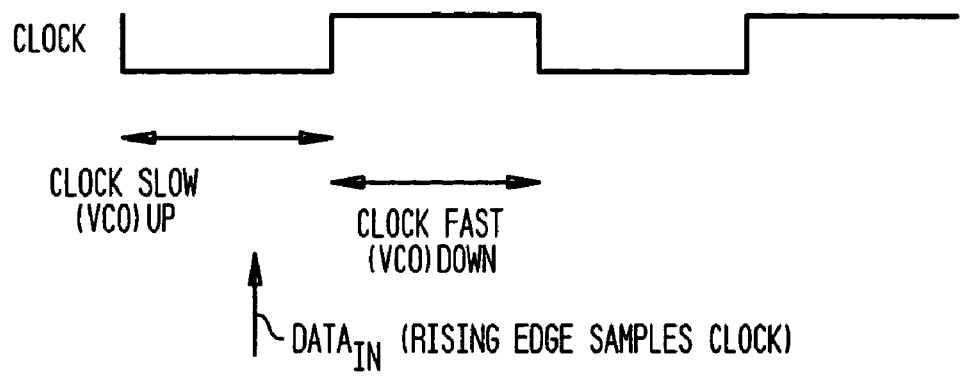
FIG. 2 shows a relation between the input data and the input clock of the phase detector of FIG. 1.
Figure 3:
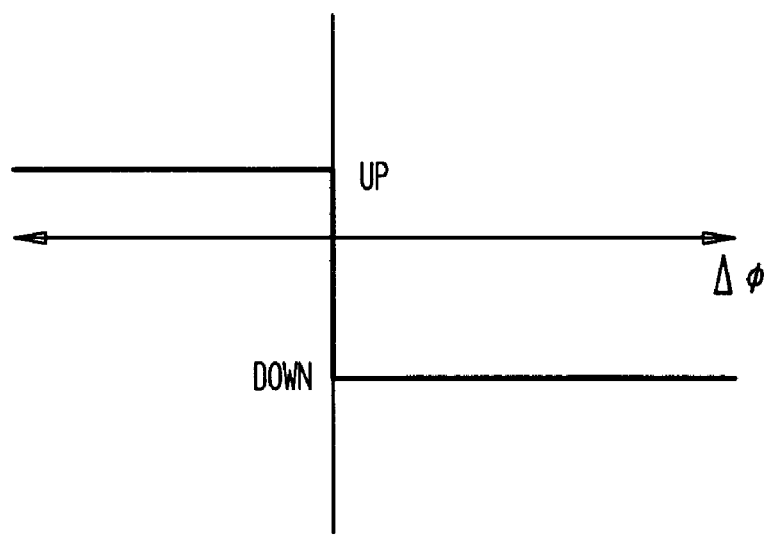
FIG. 3 shows the control signal generated by the phase detector of FIG. 1.

PD 103 is desirably implemented as a bang-bang phase detector, in which the input data $DATA_{in}$ is employed to determine when to sample the input clock $CLK_{in}$. As shown in FIG. 2, for the described exemplary embodiment, the rising edge of $DATA_{in}$ samples the clock $CLK_{in}$ for detection of the phase difference $\Delta\phi$ between $DATA_{in}$ and $CLK_{in}$. Based on the detected phase difference $\Delta\phi$ between $DATA_{in}$ and $CLK_{in}$, PD 103 generates an UP signal when the frequency of $CLK_{in}$ is too slow and generates a DOWN signal when the frequency of $CLK_{in}$ is too fast, as shown in FIG. 3. The falling edge of $CLK_{in}$ is employed to sample the data value of $DATA_{in}$ to generate retimed output data $DATA_{out}$, as described subsequently with respect to FIG. 4.

Figure 4:
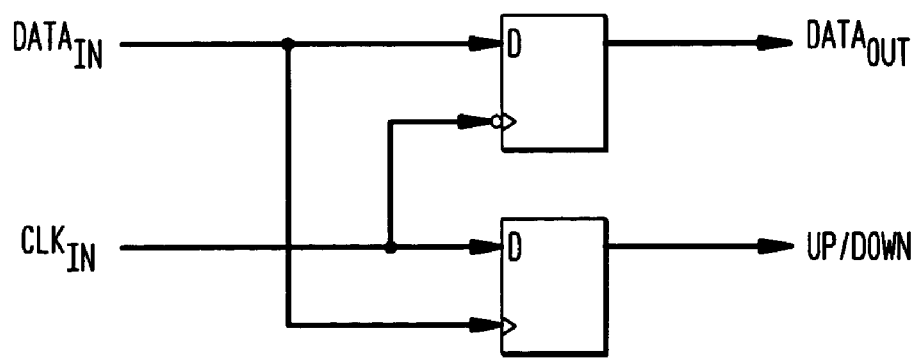
FIG. 4 shows an exemplary embodiment of the phase detector of FIG. 1.

FIG. 4 shows an exemplary embodiment of PD 103 of FIG. 1. PD 103 comprises two D flip-flops 401 and 402. D flip-flop 402 receives the input clock $CLK_{in}$ and is clocked by the rising edge of input data $DATA_{in}$. Thus, D flip-flop 402 samples $CLK_{in}$ with $DATA_{in}$ to generate the UP/DOWN signal. D flip-flop 401 receives the input data $DATA_{in}$ and is clocked by the rising edge of the complement of $CLK_{in}$. The rising edge of the complement of $CLK_{in}$ corresponds to the falling edge of $CLK_{in}$, which complement of $CLK_{in}$ may be provided as the output clock $CLK_{out}$ shown in FIG. 1. Thus, D flip-flop 401 samples $DATA_{in}$ to generate re-timed output data $DATA_{out}$. One skilled in the art might employ other types of bang-bang phase detector known in the art for PD 103.

Operation of the inner feedback loop to set control voltage $KL_{vco}$ is now described. Returning to FIG. 1, the UP/DOWN signal from PD 103 is applied to ICP 111 and PCP 112 (multiplexer 109 is optional, as described subsequently, and for the following discussion the output of PD 103 is directly coupled to ICP 111 and PCP 112). The UP/DOWN signal from PD 103 is provided as a proportional control signal PCS to charge pump 105 and is provided as an integral control signal ICS to charge pump 104. The proportional control signal might be a non-return-to-zero (NRZ) signal, and the integral control signal might be a truncated version of the NRZ control signal, such as a return-to-zero (RZ) control signal.

Charge pump 104 steers current $I_{icp}$ to capacitor C1, where charge pump 104 steers current Iip up or down based on the integral control signal ICS from PD 103. Similarly, charge pump 105 steers current $I_{pcp}$ to resistor R1, where charge pump 105 steers current $I_{pcp}$ up or down based on the proportional control signal PCS from PD 103. Here, "steering" current refers to adding or subtracting charge with positive or negative current direction. Voltages across ICP 111 and PCP 112 (i.e., voltages $V_{int}$ and $V_{prop}$ across C1 and R1, respectively) are combined by voltage adder 106 to generate by $KL_{vco}$. The voltage $V_{prop}$ sets the bang-bang frequency $\pm\Delta F_{bb}$ of the inner loop, which are the bounds of the frequency variation of the inner loop. The voltage $V_{int}$ sets the base, or center, frequency of the inner loop.

The voltages $V_{prop}$ and $V_{int}$ may be as given in equations (1) and (2):

$$V_{prop} = I_{pcp} * R1 \quad (1)$$

$$V_{int} = (I_{icp} \Delta t / C1) \quad (2)$$

where $\Delta t$ is an increment of time based on the sampling period of PD 103 and is truncated for the integral path. An associated system stability $\zeta$ is as given in equation (3):

$$\zeta \propto \frac{V_{prop}}{V_{int}} = \frac{I_{pcp} R1}{(I_{icp} \Delta t / C1)} = \frac{I_{pcp}}{I_{icp} \Delta t} R1 C1 \quad (3)$$

Consequently, the system stability $\zeta$ increases as the ratio of $V_{prop}$ to $V_{int}$ increases.

The combination of the two voltages $V_{prop}$ and $V_{int}$ from voltage adder 106 drives VCO 101 into phaselock. For some embodiments of the present invention, C1 might be formed in an integrated circuit (IC), and so the inner loop is desirably stable for all operating frequencies of PLL 100.

The inventors have determined that the higher the ratio of $V_{prop}$ to $V_{int}$ the more stable the inner loop of PLL 100. If capacitor C1 were an external component of an IC, capacitor C1 might be set as large as is required for a given implementation in order to satisfy the stability requirement, but if capacitor C1 is formed in an IC, limits might be imposed on the value of C1.

Employing ICP 111 and PCP 112 (i.e., employing separate charge pumps) allows for capacitance multiplication. Capacitance multiplication is a characteristic of a circuit that makes a capacitance value appear to be larger than the actual capacitance of a circuit component. Two charge pumps allow for preservation of the ratio $V_{prop}$ to $V_{int}$, by reducing either i) $I_{icp}$, ii) Δt, or iii) a combination of these values, thus allowing for operation of PLL 100 that may otherwise require larger values of capacitance for C1.

A bang-bang phase detector is a non-linear system because the feedback phase error is non-linear, resulting in a non-linear loop, and so the phase response of the system has a slew-limited nature. Any applied jitter to an input signal of the system is tracked up to the stewing point of the loop. For a very small level of applied jitter, the loop will track the jitter so as to appear as a very wide-band loop. The 3-dB loop bandwidth $F_{3dB}$ is inversely proportional to the applied jitter $JT_{in}$, as given in equation (4):

$$F_{3dB} \propto (\Delta F_{bb}/JT_{in}) \quad (4)$$

Returning to FIG. 1, PLL 100 might operate during periods in which no data is present (i.e., when the signal $DATA_{in}$ doesn't exist). Consequently, PLL 100 may monitor the output signal frequency of VCO 101 and to provide inner loop control voltages $KH_{vco}$ and $KL_{vco}$ that maintain the signal frequency of VCO 101 within a predefined set of frequency bounds. Optionally, PLL 100 further comprises phase-frequency detector (PFD) 108, divide-by $N_1$ 102, frequency discriminator 120, and MUX 109.

Frequency discriminator 120 receives both $CLK_{in}$ and the reference clock $CLK_{ref}$. For example, frequency discriminator 120 may monitor $CLK_{in}$ and $CLK_{ref}$ and declare a loss of frequency lock when the difference between the input clock signals is greater than a predefined amount, such as 400 parts-per-million (PPM) in systems following SONET standards. Implementations of frequency discriminators for frequency discriminator 120 are well-known in the art. When frequency discriminator 120 declares a loss of synchronization, frequency discriminator 120 may generate a signal SWITCH to MUX 109 to switch the input of ICP 111 and PCP 112 from the output of PD 103 to the output of PFD 108.

Divide-by $N_1$ 102 divides the output of VCO 101 by N., where NJ is a positive number. PFD 108 operates as a phase detector in a similar manner to that described above with respect to PD 103, and PFD 108 generates an up/down signal based on a detected phase error between the output of divide-by $N_1$ 102 and a reference clock $CLK_{ref}$ at a predefined reference frequency.

The values of $N_1$ and $N_2$ for divide-by $N_1$ 102 and divide-by $N_2$ 102, respectively, might be determined based on the particular implementation of PLL 100. The value for $N_1$ is set based on the ratio of VCO output signal frequency to reference clock frequency, and the value for $N_2$ is set by the ratio of data signal frequency to reference clock frequency. For operation in accordance with the SONET standard, the reference clock frequency set as 155.52 MHz, and the VCO output signal frequency set as 2.48832 MHz, the values for N, and $N_2$ for varying data rates are as given in Table 1.

TABLE 1

| Data Frequency | $N_1$ | $N_2$ |
|---|---|---|
| 2.48832 MHz | 16 | 1 |
| 622.08 MHz | 16 | 4 |
| 155.52 MHz | 16 | 16 |

Some exemplary embodiments of the present invention might be employed for terminal equipment of a communications system operating in accordance with a SONET standard. For example, for a transmission terminal operating in accordance with a SONET standard, a recovered clock from a received signal is employed as the timing/synchronization source of the transmitter clock, hence a jitter transfer pole of that SONET standard is desirably adhered to. Such transmission terminal might employ an exemplary implementation of the present invention to generate a clock signal synchronized to input data received by the terminal. The specification for the jitter transfer pole of a SONET OC48 is 2 MHz. The $JT_{in}$ bound is chosen by a tolerance mask value of the SONET standard as 0.15 $UI_{p-p}$ (where p-p indicates peak-to-peak and UI indicates unit interval). From equation (4), the bang-bang frequency $\Delta F_{bb}$ where the onset of slew limiting occurs is 600 kHz.

For this example, the gain of the VCO should be relatively low, otherwise very small currents $I_{pcp}$ and $I_{icp}$, or a small value of R1, is required to generate this 600 kHz bang-bang frequency. When the loop is locked, the generated jitter $JT_{out}$ is desirably less than 0.1 $UI_{p-p}$. A value of $KL_{vco}$ for the given example might be selected as 40 MHz, if the total variation of the varactor pairs in the VCO is 500 MHz/V and the varactor pairs are a first pair having variation of 460 MHZ/V controlled by $KH_{vco}$ and a second pair having variation of 40 MHz/V controlled by $KL_{vco}$. For these pairs of varactors, R1 is set as 1875ω and $I_{pcp}$ is set as 5 μA. This gives a bang-bang frequency of 375 kHz, and a transfer bandwidth of 1.25 MHz.

Employing proportional and integral control signals to generate the voltages $V_{prop}$ to $V_{int}$ in accordance with the present invention allows for capacitance multiplication, as described subsequently. For example, the stability of the system used for the SONET OC48 and OC12 standards might be analyzed using a behavioral model of the loop in the frequency/phase domain. Employing non-return-to-zero (NRZ) charge pumps for charge pumps 104 and 105 to receive the UP/DOWN signal from the bang-bang phase detector PD 103 (which is equivalent to using only proportional control signals for both charge pumps), and applying input data $DATA_{in}$ as a length $2^{23}-1$ pseudo-random bit sequence (PRBS), no instability might be observed. However, for the SONET OC3 standard, periods of instability might be observed.

To stabilize the loop of PLL 100, such as for exemplary implementations for the SONET OC3 standard, the ratio of $V_{prop}$ to $V_{int}$ is examined. If the loop is designed so that the UP/DOWN signals are NRZ, the loop is at either plus or minus the bang frequency until the next sample of phase difference is initiated. As shown in equation (3), the ratio of $V_{prop}$ to $V_{int}$ indicates system stability, and the ratio of $V_{prop}$ to $V_{int}$ is desirably maintained as much greater than 1.

From equation (3), as the Δt value decreases, the ratio of $V_{prop}$ to $V_{int}$ increases. The Δt value is inversely proportional to the data rate, since the Δt value is related to the sampling period between the input data $DATA_{in}$ and input clock $CLK_{in}$. For an OC3 data rate this sampling period is 16 times longer than the sampling period for an OC48 data rate, as the baud rate is directly related to the NRZ time. To make the ratio of $V_{prop}$ to $V_{int}$ the same for both OC48 and OC3, as described previously, the charge pump of ICP 111 employs an integrated control signal ICS, and thus ICP 111 is selected as an RZ (return-to-zero) charge pump, limiting (reducing) the value of the Δt term in the relationship. Reducing the Δt term has the same effect as increasing (or "multiplying") the capacitance C1.

Figure 5:
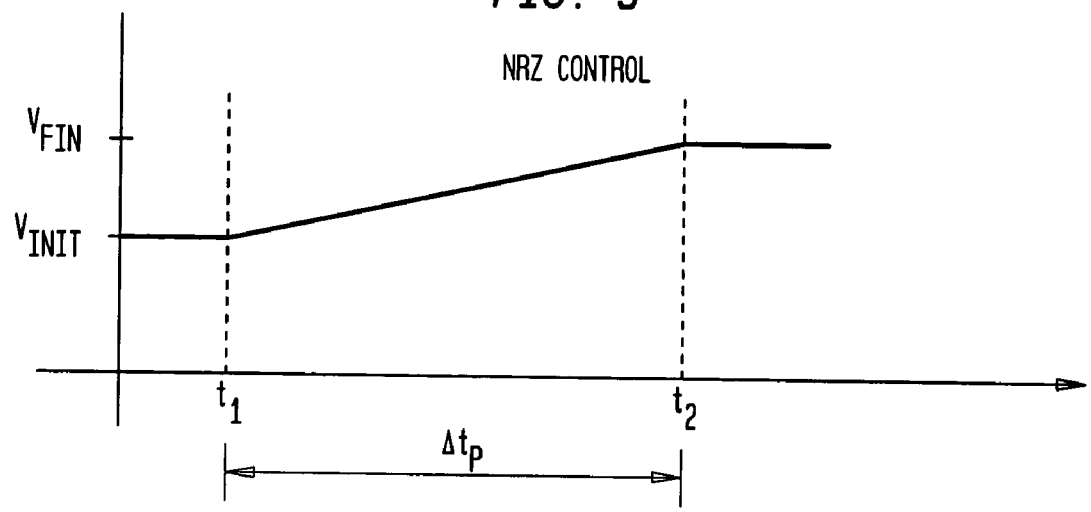
FIG. 5 shows the characteristics of a sampled non-return-to-zero charge pump.
Figure 6:
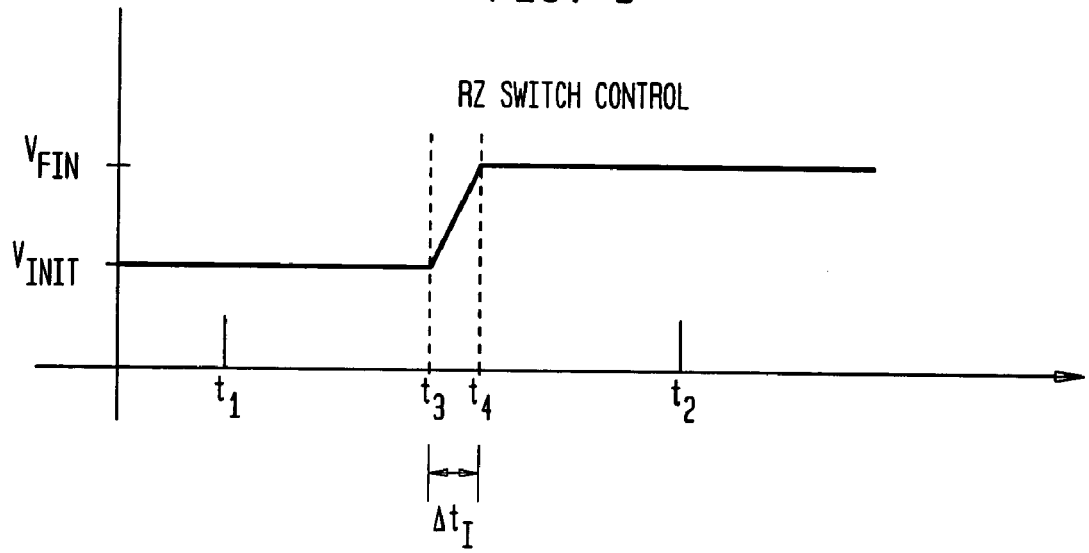
FIG. 6 shows the characteristics of a sampled return-to-zero charge pump that may be employed for the integral charge pump of FIG. 1.

FIGS. 5 and 6 illustrate the difference between operation of charge pumps 111 and 112 when the integral and proportional control signals ICS and PCS are applied. FIG. 5 shows the characteristics of the sampled NRZ charge pump that may be employed for PCP 112, and FIG. 6 shows the characteristics of the sampled RZ charge pump that may be employed for ICP 111. For both FIGS. 5 and 6, the start and end of the correction cycle points are $t_1$ and $t_2$. Thus, in FIG. 5, an NRZ control signal (across, for example, C1) yields a $\Delta t_p$ term for the voltage to change from $V_{INIT}$ to $V_{FIN}$. As shown in FIG. 6, the charge from the charge pump is delivered to the integration capacitor C1 for a finite amount of time between $t_1$ and $t_2$, which yields a $\Delta t_r$ term for the voltage to change from $V_{INIT}$ to $V_{FIN}$ that is much less than the $\Delta t_p$ term. Thus, employing the truncated proportional control signal instead of the proportional control signal over the entire correction cycle as in the NRZ charge pump of FIG. 5 reduces the time that C1 charges. Reducing the time that C1 charges lowers the value of $V_{int}$, thereby increasing the ratio of $V_{prop}$ to $V_{int}$ to stabilize the loop.

The present invention may allow for the following advantages. A given implementation may allow for all loop filters to be embodied in an integrated circuit (IC) since values of capacitance are relatively small. In addition, the jitter exhibited by a given implementation may be maintained within a given specification of, for example, a SONET standard. As described above, a given implementation may exhibit stability for SONET transmission modes OC3, OC12, and OC48.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A phase-locked loop (PLL) comprising:
a phase detector (PD) adapted to generate an up/down signal based on a phase difference between a data signal and a clock signal input to the PD, wherein the phase error is generated by sampling of the clock signal by the data signal;
a proportional charge pump adapted to generate a first voltage for a first time period based on the up/down signal;
an integral charge pump adapted to generate a second voltage for a second time period across a capacitor based upon the capacitance of the capacitor, a truncated version of the up/down signal, and a sampling rate of the data by the PD, wherein the second time period is less than the first time period; and a voltage-controlled oscillator (VCO) adapted to generate the clock signal based upon a combination of the first and second voltages;
wherein the phase detector is a bang-bang phase detector.

2. A phase-locked loop (PLL) comprising:
a phase detector (PD) adapted to generate an up/down signal based on a phase difference between a data signal and a clock signal input to the PD, wherein the phase error is generated by sampling of the clock signal by the data signal;
a proportional charge pump adapted to generate a first voltage for a first time period based on the up/down signal;
an integral charge pump adapted to generate a second voltage for a second time period across a capacitor based upon the capacitance of the capacitor, a truncated version of the up/down signal, and a sampling rate of the data by the PD, wherein the second time period is less than the first time period; and a voltage-controlled oscillator (VCO) adapted to generate the clock signal based upon a combination of the first and second voltages;
wherein the VCO comprises an inductor-capacitor (LC) oscillator, the combination of the first and second voltages setting a first portion of the LC oscillator capacitance, and a third voltage setting a second portion of the LC oscillator capacitance.

3. The invention as recited in claim 2, wherein the VCO comprises first and second pairs of varactors, the combination of the first and second voltages setting the first portion of the LC oscillator capacitance of the first pair of varactors, and a third voltage setting second portion of the LC oscillator capacitance of the second pair of varactors.

4. The invention as recited in claim 2, wherein the third voltage is generated as a combination of the second voltage and a reference voltage.

5. The invention as recited in claim 4, comprising a temperature compensation circuit having first and second input ports coupled to the second voltage and the reference voltage, respectively, wherein:
the temperature compensation circuit is adapted to generate the third voltage based on a difference between the second voltage and the reference voltage, and
the third voltage tends to operate the VCO in a manner so as to compensate for temperature variations.

6. The invention as recited in claim 5, wherein the temperature compensation circuit comprises an amplifier having the first and second input ports and an output port coupled to one terminal of a second capacitor, the other terminal of the capacitor coupled to a common voltage and the third voltage appearing across the second capacitor.

7. A phase-locked loop (PLL) comprising:
a phase detector (PD) adapted to generate an up/down signal based on a phase difference between a data signal and a clock signal input to the PD, wherein the phase error is generated by sampling of the clock signal by the data signal;
a proportional charge pump adapted to generate a first voltage for a first time period based on the un/down signal;
an integral charge pump adapted to generate a second voltage for a second time period across a capacitor based upon the capacitance of the capacitor, a truncated version of the up/down signal, and a sampling rate of the data by the PD, wherein the second time period is less than the first time period; and a voltage-controlled oscillator (VCO) adapted to generate the clock signal based upon a combination of the first and second voltages;
wherein the integral charge pump comprises a return-to-zero charge pump.

8. The invention as recited in claim 7, wherein the second voltage $V_{int}$ is $$V_{int} = (I_{icp} \Delta t / C1),$$

where $I_{icp}$ is a current of the integral charge pump set by the up/down signal, $\Delta t$ is a time interval based on the sampling rate of the data, and C1 is the capacitance of the capacitor.

9. The invention as recited in claim 8, wherein the first voltage $V_{prop}$ is $$V_{prop} = I_{pcp} * R1,$$

where $I_{pcp}$ is a current of the proportional charge pump set by the up/down signal, and R1 is a resistance of a resistor across which the first voltage appears.

10. The invention as recited in claim 9, wherein a stability $\zeta$ of the PLL is:

$$\zeta \propto \frac{V_{prop}}{V_{int}} = \frac{I_{pcp}}{I_{icp} \Delta t} R1C1.$$

11. A phase-locked loop (PLL) comprising:
a phase detector (PD) adapted to generate an up/down signal based on a phase difference between a data signal and a clock signal input to the PD, wherein the phase error is generated by sampling of the clock signal by the data signal;
a proportional charge pump adapted to generate a first voltage for a first time period based on the up/down signal;
an integral charge pump adapted to generate a second voltage for a second time period across a capacitor based upon the capacitance of the capacitor, a truncated version of the up/down signal, and a sampling rate of the data by the PD, wherein the second time period is less than the first time period; and a voltage-controlled oscillator (VCO) adapted to generate the clock signal based upon a combination of the first and second voltages;
wherein the proportional charge pump comprises a non-return-to-zero charge pump.

12. A phase-locked loop (PLL) comprising:
a phase detector (PD) adapted to generate an up/down signal based on a phase difference between a data signal and a clock signal input to the PD, wherein the phase error is generated by sampling of the clock signal by the data signal;
a proportional charge pump adapted to generate a first voltage for a first time period based on the up/down signal;
an integral charge pump adapted to generate a second voltage for a second time period across a capacitor based upon the capacitance of the capacitor, a truncated version of the up/down signal, and a sampling rate of the data by the PD, wherein the second time period is less than the first time period; and a voltage-controlled oscillator (VCO) adapted to generate the clock signal based upon a combination of the first and second voltages;
further comprising a phase-frequency detector and a multiplexer (MUX), wherein:
the phase-frequency detector is adapted to:
1) compare the clock signal and a reference signal,
2) generate a switch signal based on the comparison of the clock signal and the reference signal, and
3) generate a phase difference between the clock signal and the reference signal; and
the MUX is adapted to select either i) the up/down signal or ii) the phase difference between the clock signal and the reference signal as an input to the proportional and integral charge pumps,
wherein the proportional and integral charge pumps generate the first and second voltages based upon the phase difference between the clock signal and the reference signal when selected as the input by the MUX.

13. The invention as recited in claim 7, further comprising a divide-by-N, N a positive number, the divide-by-N adapted to divide an output signal of the VCO by N to provide the clock signal.

14. The invention as recited in claim 7, wherein the PD is further adapted to generate a retimed data signal based on the clock signal, wherein the retimed data signal is generated by the PD by sampling of the data signal by the clock signal.

15. The invention as recited in claim 7, wherein the PLL is embodied in an integrated circuit.

16. A method of implementing a phase-locked loop (PLL) comprising the steps of:
(a) generating, by a phase detector (PD), an up/down signal based on a phase difference between a data signal and a clock signal input to the PD, wherein the phase error is generated by sampling of the clock signal by the data signal;
(b) generating a first voltage for a first time period based on the up/down signal; and
(c) generating a second voltage for a second time period across a capacitor based upon the capacitance of the capacitor, a truncated version of the up/down signal, and a sampling rate of the data by the PD, wherein the second time period is less than the first time period;
(d) combining the first and second voltages; and
(e) generating, with a voltage-controlled oscillator (VCO), the clock signal based upon the combination of the first and second voltages;
wherein, for step (a), the phase detector is a bang-bang phase detector.

17. The invention as recited in claim 16, wherein, for step (c), the second voltage $V_{int}$ is $$V_{int}=(I_{icp}\Delta t/C1),$$

where $I_{icp}$ is a current of the integral charge pump set by the up/down signal, $\Delta t$ is a time interval based on the sampling rate of the data, and C1 is the capacitance of the capacitor.

18. The invention as recited in claim 17, wherein, for step (c), the first voltage $V_{prop}$ is $$V_{prop}=I_{pcp}*R1,$$

where $I_{pcp}$ is a current of the proportional charge pump set by the up/down signal, and R1 is a resistance of a resistor across which the first voltage appears.

19. The invention as recited in claim 18, wherein a stability $\zeta$ of the PLL is:

$$\zeta \propto \frac{V_{prop}}{V_{int}} = \frac{I_{pcp}}{I_{icp}\Delta t}R1C1.$$

20. A method of implementing a phase-locked loon (PLL) comprising the steps of:
 (a) generating, by a phase detector (PD), an up/down signal based on a phase difference between a data signal and a clock signal input to the PD, wherein the phase error is generated by sampling of the clock signal by the data signal;
 (b) generating a first voltage for a first time period based on the up/down signal; and
 (c) generating a second voltage for a second time period across a capacitor based upon the capacitance of the capacitor, a truncated version of the up/down signal, and a sampling rate of the data by the PD, wherein the second time period is less than the first time period;
 (d) combining the first and second voltages; and
 (e) generating, with a voltage-controlled oscillator (VCO), the clock signal based upon the combination of the first and second voltages;
 wherein, for step (e), the VCO comprises an inductor-capacitor (LC) oscillator, and step (d) comprises the steps of (d1) setting a first portion of the LC oscillator capacitance based on the combination of the first and second voltages, (d2) generating a third voltage, and (d3) setting a second portion of the LC oscillator capacitance based on the third voltage.

21. The invention as recited in claim 20, wherein, for step (e), the VCO comprises first and second pairs of varactors, the combination of the first and second voltages setting the first portion of the LC oscillator capacitance of the first pair of varactors, and the third voltage setting second portion of the LC oscillator capacitance of the second pair of varactors.

22. The invention as recited in claim 20, wherein the third voltage is generated by the step of combining the second voltage and a reference voltage.

23. The invention as recited in claim 22, comprising the steps of:
 generating the third voltage based on a difference between the second voltage and the reference voltage, and
 operating, based on the third voltage, the VCO in a manner so as to compensate for temperature variations.

24. A method of implementing a phase-locked loop (PLL) comprising the steps of:
 (a) generating, by a phase detector (PD), an up/down signal based on a phase difference between a data signal and a clock signal input to the PD, wherein the phase error is generated by sampling of the clock signal by the data signal;
 (b) generating a first voltage for a first time period based on the up/down signal; and
 (c) generating a second voltage for a second time period across a capacitor based upon the capacitance of the capacitor, a truncated version of the up/down signal, and a sampling rate of the data by the PD, wherein the second time period is less than the first time period;
 (d) combining the first and second voltages; and
 (e) generating, with a voltage-controlled oscillator (VCO), the clock signal based upon the combination of the first and second voltages;
 further comprising the steps of:
 comparing the clock signal and a reference signal,
 generating a switch signal based on the comparison of the clock signal and the reference signal, and
 generating a phase difference between the clock signal and the reference signal; and
 selecting either i) the up/down signal or ii) the phase difference between the clock signal and the reference signal as an input to the proportional and integral charge pumps, and
 wherein the first and second voltages are generated based upon the phase difference between the clock signal and the reference signal when selected as the input by the MUX.

25. The invention as recited in claim 16, further comprising the step of generating a retimed data signal based on the clock signal, wherein the retimed data signal is generated by the PD by sampling of the data signal by the clock signal.

26. The invention as recited in claim 16, wherein the method is embodied as steps of a processor in an integrated circuit.

27. The invention as recited in claim 7, wherein the phase detector is a bang-bang phase detector.

28. The invention as recited in claim 7, wherein the VCO comprises an inductor-capacitor (LC) oscillator, the combination of the first and second voltages setting a first portion of the LC oscillator capacitance, and a third voltage setting a second portion of the LC oscillator capacitance.

29. The invention as recited in claim 7, further comprising a phase-frequency detector and a multiplexer (MUX), wherein:
 the phase-frequency detector is adapted to:
  1) compare the clock signal and a reference signal,
  2) generate a switch signal based on the comparison of the clock signal and the reference signal, and
  3) generate a phase difference between the clock signal and the reference signal; and
 the MUX is adapted to select either i) the up/down signal or ii) the phase difference between the clock signal and the reference signal as an input to the proportional and integral charge pumps,
 wherein the proportional and integral charge pumps generate the first and second voltages based upon the phase difference between the clock signal and the reference signal when selected as the input by the MUX.

30. The invention as recited in claim 11, wherein the phase detector is a bang-bang phase detector.

31. The invention as recited in claim 11, wherein the VCO comprises an inductor-capacitor (LC) oscillator, the combi nation of the first and second voltages setting a first portion of the LC oscillator capacitance, and a third voltage setting a second portion of the LC oscillator capacitance.

32. The invention as recited in claim 11, further comprising a phase-frequency detector and a multiplexer (MUX), wherein:
  the phase-frequency detector is adapted to:
    1) compare the clock signal and a reference signal,
    2) generate a switch signal based on the comparison of the clock signal and the reference signal, and
    3) generate a phase difference between the clock signal and the reference signal; and
  the MUX is adapted to select either i) the up/down signal or ii) the phase difference between the clock signal and the reference signal as an input to the proportional and integral charge pumps, wherein the proportional and integral charge pumps generate the first and second voltages based upon the phase difference between the clock signal and the reference signal when selected as the input by the MUX.

* * * * *